(12) United States Patent
Turner

(10) Patent No.: US 7,403,764 B2
(45) Date of Patent: Jul. 22, 2008

(54) RF POWER DELIVERY DIAGNOSTIC SYSTEM

(76) Inventor: Terry R. Turner, 9505 Scenic Bluff, Austin, TX (US) 78733

(*) Notice: Subject to any disclaimer, the term of this patent is extended or adjusted under 35 U.S.C. 154(b) by 658 days.

(21) Appl. No.: 10/999,488

(22) Filed: Nov. 30, 2004

(65) Prior Publication Data

US 2006/0116106 A1 Jun. 1, 2006

(51) Int. Cl.
*H04M 1/66* (2006.01)
(52) U.S. Cl. .............. 455/410; 455/248.1; 455/320; 455/330; 702/106; 315/111.21
(58) Field of Classification Search .............. 455/410, 455/248.1, 320, 330; 702/106; 315/111.21
See application file for complete search history.

(56) References Cited

U.S. PATENT DOCUMENTS

| 5,770,922 | A | | 6/1998 | Gerrish et al. ......... 315/111.21 |
|---|---|---|---|---|
| 5,808,415 | A | | 9/1998 | Hopkins ................ 315/111.21 |
| 5,834,931 | A | | 11/1998 | Moore et al. .................. 324/95 |
| 5,867,020 | A | * | 2/1999 | Moore et al. .................. 324/95 |
| 5,971,591 | A | * | 10/1999 | Vona et al. .................. 700/220 |
| 6,061,006 | A | | 5/2000 | Hopkins ....................... 341/61 |
| 6,501,285 | B1 | | 12/2002 | Hopkins et al. ............. 324/687 |
| 6,608,446 | B1 | * | 8/2003 | Coumou ................ 315/111.21 |
| 6,983,215 | B2 | * | 1/2006 | Coumou et al. ............. 702/106 |
| 2004/0021454 | A1 | * | 2/2004 | Jevtic et al. ................ 324/72.5 |

* cited by examiner

*Primary Examiner*—Sanh D. Phu
(74) *Attorney, Agent, or Firm*—Hulsey IP Intellectual Property Lawyers, PC

(57) ABSTRACT

An RF power delivery diagnostic system is provided herein. The system comprises an RF power source (303), an impedance matching network (305), a plasma reactor (307) in electrical contact with the RF power source by way of the impedance matching network, a first RF sensor (309) adapted to measure at least one attribute of the RF power input to the impedance matching network, and a second RF sensor (311) adapted to measure at least one attribute of the RF power output by the impedance matching network.

34 Claims, 3 Drawing Sheets

RF POWER DELIVERY DIAGNOSTIC SYSTEM

CROSS-REFERENCE TO RELATED PATENT APPLICATIONS

This patent application claims priority to U.S. patent application Ser. No. 10/668,398, filed Sep. 23, 2003, entitled "Transducer Package for Process Control", and which is incorporated by reference herein in its entirety; U.S. patent application Ser. No. 10/954,459, filed Sep. 30, 2004, entitled "A Shielding Assembly for an RF Sensor", and which is incorporated by reference herein in its entirety; and U.S. patent application Ser. No. 10/851,423, filed May 21, 2004, entitled "RF Sensor Clamp Assembly", and which is incorporated by reference herein in its entirety.

FIELD OF THE INVENTION

The present disclosure relates generally to impedance networks in RF powered systems, and more particularly, to systems and methods for measuring the power at the output of an impedance network.

BACKGROUND OF THE INVENTION

Plasma etch and deposition processes have become the dominant pattern transfer means used in semiconductor manufacturing over the past 20 years. Most plasma based processes employ the fundamental principle of disassociation of a feed gas by the application of radio frequency (RF) power. As with all plasma loads, one of the dominant characteristics of the plasma load is its non-linearity. The non-linearity of the load affects the voltage and current sine waves of the delivered RF power by creating prevalent harmonic distortion. The exact amount of harmonic distortion, as represented by the amplitude of the harmonic frequencies and the associated phase angle of the current harmonic relative to the corresponding voltage harmonic, is unique to the plasma creating them. To be more precise, the plasma parameters, including ion and electron densities and energies, collision frequencies, neutral constituents, and their respective densities all contribute in a unique way to the amplitude of specific harmonic components of the fundamental frequency applied by a power delivery source to achieve the desired disassociation and subsequent process results.

It is thus apparent that, by monitoring the harmonic components of the fundamental frequency applied by a power delivery source, enhanced process control of plasma deposition and etch processes may be obtained. Consequently, several products have been developed that are designed to provide enhanced process control by monitoring such RF harmonic content. Unfortunately, wide scale proliferation of this technology has not been realized due to several fundamental limitations in the available technology.

One of the most significant limitations in the existing technology has to do with product architecture. To date, several devices are known for monitoring the harmonic content of delivered RF power. Each of these devices requires precise calibration of its individual components. Original hardware designed for plasma process control RF sensors in existing solutions has been based on either: a) RF switch routed band pass filters; (b) directional couplers; or (c) heterodyne or digital signal processor circuitry enabled with programmable local oscillators. Each of these designs comprises a transducer package, commonly located at the point of measurement, and a corresponding analysis and communications electronics package, which is typically located remotely from the point of measurement.

Since each transducer package provides a unique output, these two packages are specifically calibrated to work with each other. Consequently, it is not possible to replace either package independently of the other without recalibrating the system. Since downtime is extremely expensive in a semiconductor processing line, the need for recalibration creates serious maintenance and support issues for users of these RF sensor based process control solutions. Consequently, a need exists in the art for methods and devices that will support a field replacement strategy that allows any transducer package to function properly with any corresponding analysis and communications package, without degradation in performance and without the need for recalibration.

A further issue with existing devices for monitoring the harmonic content of delivered RF power in semiconductor processing has to do with the detector circuits that can be used with these devices. In particular, existing devices, such as those described in U.S. Pat. No. 5,770,992 (Waters), U.S. Pat. No. 5,565,737 (Keane), U.S. Pat. No. 6,046,594 (Mavretic), U.S. Pat. No. 5,808,415 (Hopkins) and U.S. Pat. No. 6,061,006 (Hopkins), all rely on AC coupled voltage and current measurements of the delivered RF power which serve as input signals to frequency discriminating detection circuits for harmonic analysis. Such a configuration places limitations on the detector circuits that can be used to analyze the broadband, harmonically distorted RF signals. Moreover, these devices require interface electronics to process the sampled signals before use in any subsequent application. Also, each of these devices is configured such that the transducer package and associated analysis or interface electronics package are calibrated together and cannot be separated without failure or degradation in overall performance. The shortcomings of such a configuration have been discussed above. There is thus a need in the art for a device for monitoring the harmonic content of delivered RF power that overcomes these deficiencies.

Another issue relating to RF power supplies for plasma reactors concerns the diagnosis of the components of an RF power delivery network. Semiconductor manufacturing facilities are extremely expensive to construct and operate. Consequently, every effort is made to minimize manufacturing tool down time, and maintenance and recovery of an off-line tool is always under excessive time constraints. Often, when a tool is taken off-line due to a failure to meet performance specifications, repair efforts suffer from a lack of diagnostics. Consequently, such repair efforts often become extremely expensive.

FIG. 1 shows a typical configuration for such a system. The system 100 comprises an RF generator 101, an impedance matching network 130, and a load 150. Generator 100 is coupled to impedance matching network 130 through a known impedance 120. This impedance is typically a nominal characteristic value, such as 50 ohms. Impedance 120 serves to facilitate optimal power transfer from the generator to matching network 130. The impedance 140 seen between matching network 130 and load 150 is generally unknown and varies over time.

Most RF power generators have "built-in" output measurement capability, but this is typically located remote from the impedance matching network. Measurement of input power at the input of the impedance matching network has historically been provided by utilization of bolo-meters, calorimeters, diodes and other types of instrumentation. Examples of prior art methods for making RF power measurements in coaxial environments may be found in U.S. Pat. No. 4,547,728 (Mecklenburg), U.S. Pat. No. 4,263,653 (Mecklenburg) and U.S. Pat. No. 4,080,566 (Mecklenburg), all of which rely on an inductive coil design to sample the RF voltage. However, since the measurement to be performed is typically diagnostic and only necessary during maintenance and troubleshooting, the cost, portability and ease of installation are of paramount concern.

Typical prior art methods for measuring the power at the output of the impedance network rely on alternating current (AC) coupled voltage and current measurements of the RF power delivered to the load. These measurements are input to frequency discrimination circuitry for the purpose of performing harmonic analysis. Examples of prior art methods for monitoring components for delivering RF power in semiconductor processing are described in numerous patents, including, for example, U.S. Pat. No. 5,770,992 (Waters), U.S. Pat. No. 5,565,737 (Keane), U.S. Pat. No. 6,046,594 (Mavretic), U.S. Pat. No. 5,808,415 (Hopkins) and U.S. Pat. No. 6,061,006 (Hopkins). These systems also comprise a transducer package and associated analysis or interface electronics package which are calibrated together, and thus have the infirmities noted above (that is, they cannot be separated without degradation in overall performance).

Traditional RF power measurement technologies offer solutions in either the characteristic impedance portion of the delivery network or the non-characteristic impedance section without any integration of the two measurement devices. Some attempts have been made to integrate expensive and difficult to install frequency discriminating RF sensors, but these have met with poor acceptance due to price and installation issues. There is thus a need in the art for a means for field engineers to quickly, easily, cheaply and accurately diagnose the components of the RF power delivery network and determine which, if any, components of the system are faulty.

The above noted needs are met by the devices and methodologies disclosed herein and hereinafter described.

BRIEF DESCRIPTION OF THE DRAWINGS

For a more complete understanding of the present invention, and the advantages thereof, reference is now made to the following brief descriptions taken in conjunction with the accompanying drawings, in which like reference numerals indicate like features.

DETAILED DESCRIPTION OF THE INVENTION

It has now been found that the aforementioned needs can be met in RF powered devices by providing RF sensors both upstream and downstream of the impedance matching network in the device or, in some embodiments, by incorporating one or both of these sensors into the impedance matching network itself or into a device which contains the impedance matching network. By so doing, a system diagnostic can be easily performed on the device to determine, for example, whether any existing problems are occurring upstream of the impedance matching network (i.e., in the RF power source or in the portion of cable connecting the RF power source to the impedance matching network), in the impedance matching network itself, or downstream of the impedance matching network. Such an approach has several advantages, one of which is the avoidance of the unnecessary and costly replacement and/or recertification of the impedance matching network due to misdiagnosis of problems in the device.

It has also been found that an RF sensor for measurement of the power upstream of the impedance matching network can be made which is greatly simplified. In particular, such a sensor can be made which is configured to measure only voltage or only current. Since the sensor will be placed in a fixed impedance environment (typically 50 ohms), it is not necessary to measure any further parameters for the purpose of calculating power, which thus greatly simplifies sensor design.

It has further been found that, in systems for monitoring the harmonic content of the RF signal delivered to an RF powered device, the need for recalibration each time an RF sensor (or the corresponding control and communications package) is replaced can be avoided by providing a memory device for storing calibration coefficients. Such a memory device is preferably in communication with at least one, and preferably both, of the voltage transducer and current transducer, and contains calibration information specific to the at least one transducer. Such a memory device may be used in combination with the conversion of high frequency analog signals to a digital protocol suitable for processing local to the point of measurement. When combined with the local storage of necessary calibration information, this feature provides a calibrated digital output of measured values.

Figure 1:
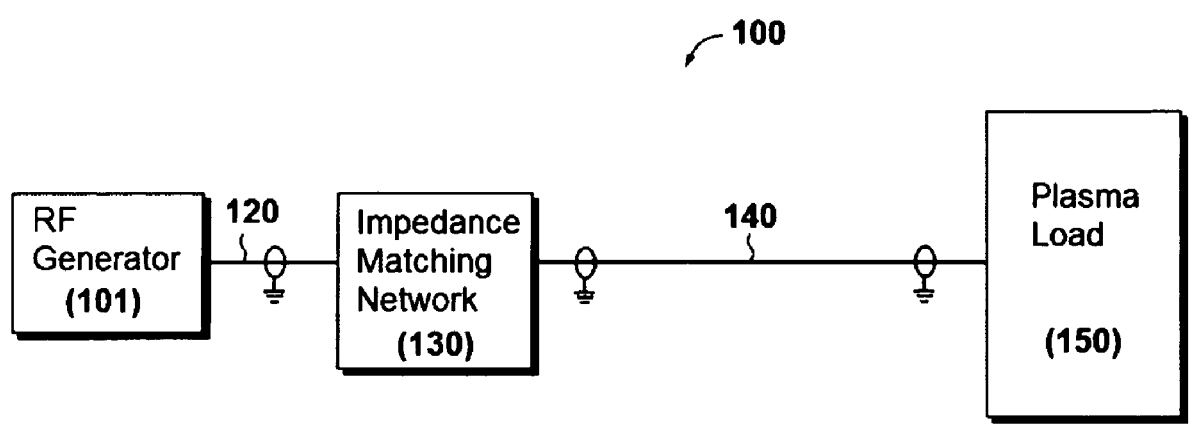
FIG. 1 is an illustration of a conventional RF power delivery system.
Figure 2:
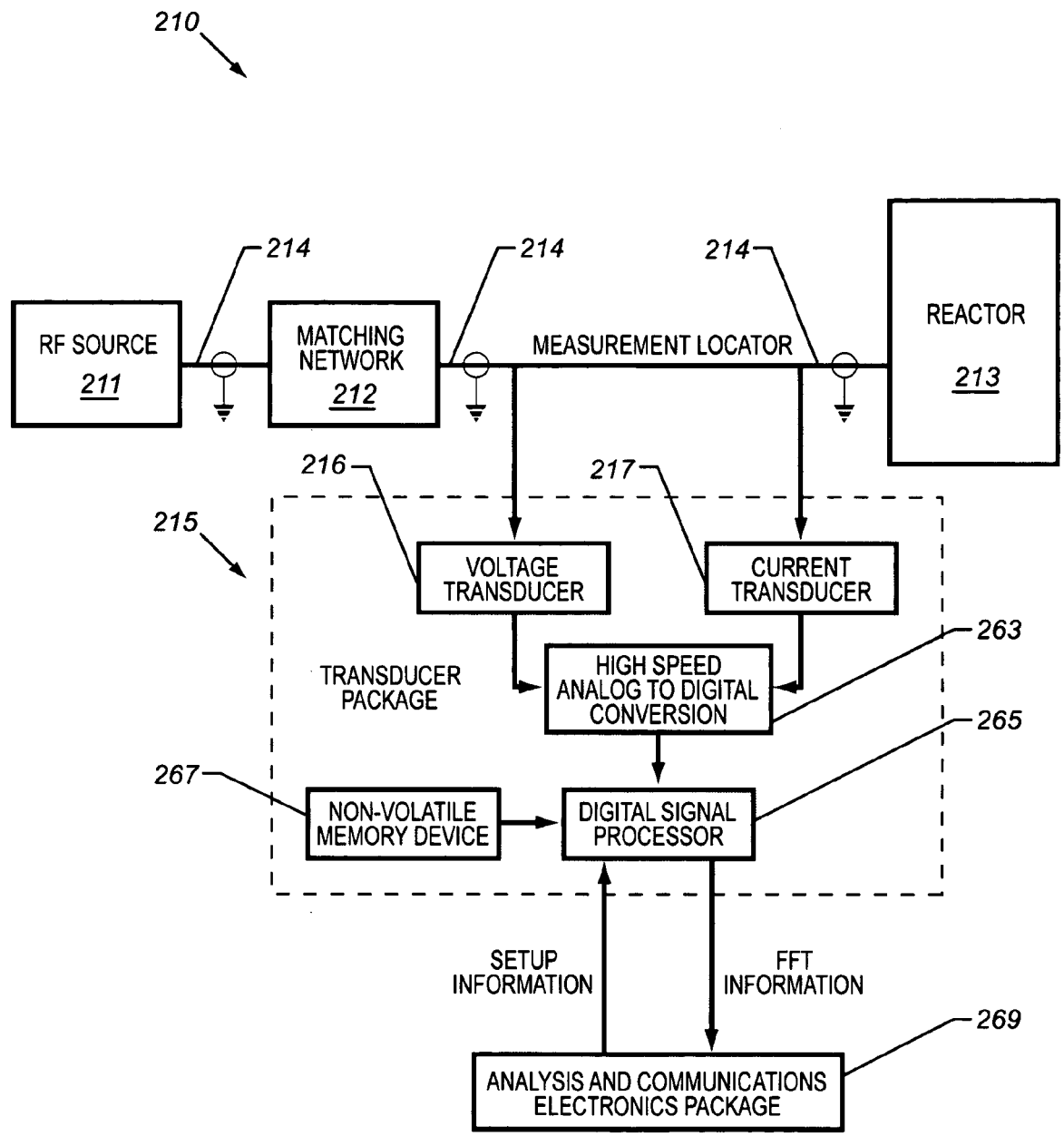
FIG. 2 is a schematic illustration of an RF sensor made in accordance with the teachings herein.

Referring to FIG. 2, a block diagram showing one non-limiting embodiment of a utilization of an RF sensor in an RF controlled device made in accordance with the teachings herein is shown. In this exemplary system 210, an electrical source in the form of an RF generator 211 (RF source) is coupled to a processing reactor 213 through an impedance matching network 212 by transmission line 214. The reactor 213 can be any of a variety of RF powered reactors, such as plasma reactors, which are suitable for processing a variety of materials, including semiconductor wafers. Moreover, one skilled in the art will appreciate that a variety of processing systems utilizing electrical or microwave energy (including RF) sources are known to the art, and that any one of these systems, or various combinations of such systems, can be utilized in the practice of the teachings described herein. Furthermore, while the use of an impedance matching network 212 is preferred, it is not necessarily required in all applications of the sensors described herein.

As shown in FIG. 2, a transducer package 215 is inserted serially in the transmission line 214 (which is typically coaxial) in a location proximal to the reactor 213, and is preferably disposed at some point after the impedance matching network 212. It is preferred to have the transducer package 215 in as close proximity to the reactor 213 as possible, so that the measurements obtained from the transducer package 215 are indicative of actual V and I values entering the reactor 213. Both V and I values are sensed at substantially the same point on the transmission line 214 in order to determine the power entering the reactor 213 and, in some instances, a phase relationship between the V and I.

Appropriate broadband voltage 216 and current 217 transducers are incorporated into the transducer package 215. These transducers are designed to sample, respectively, the voltage and current components of the delivered RF power. The transducer package further includes a high speed analog to digital converter (ADC) 263, a digital signal processor (DSP) 265, and a (preferably non-volatile) memory device 267. The transducer package 215 is preferably maintained in a measurement location which is local to the RF transmission line 214.

The configuration shown in FIG. 2 further comprises an analysis and communications package 269 which is preferably located remotely from the transducer package 215. Communications between the transducer package 215 and the remote analysis and communications package 269 typically comprise setup commands which are sent to the DSP and which are necessary for proper operation of the Fast Fourier Transform (FFT) algorithm, and the results of the FFT from the DSP.

The (preferably non-volatile) memory device 267 included in the transducer package is a notable improvement over existing transducer packages. This memory device stores necessary calibration information specific to the transducer package for access by the system, and may also store other appropriate information, such as serial numbers and other information necessary for tracking purposes. Since the calibration information for the transducers is available in the transducer package, there is no need to recalibrate the system when it is necessary to replace either the transducer package or the associated communications and analysis package. Consequently, the transducer package disclosed herein solves a well known field maintenance problem associated with RF sensors.

Typically, the memory device 267 included in the transducer package will be a built-in component of one of the PCBs utilized in the RF sensor. However, other types of memory devices may also be utilized, including removable memory chips that are insertable into a port provided on a PCB. These include, but are not limited to, disks, memory sticks, and other such devices. Memory devices may also be utilized that are not directly attached to a PCB, but are in communication with the appropriate circuitry, as by wireless transmission or through other suitable means.

Figure 3:
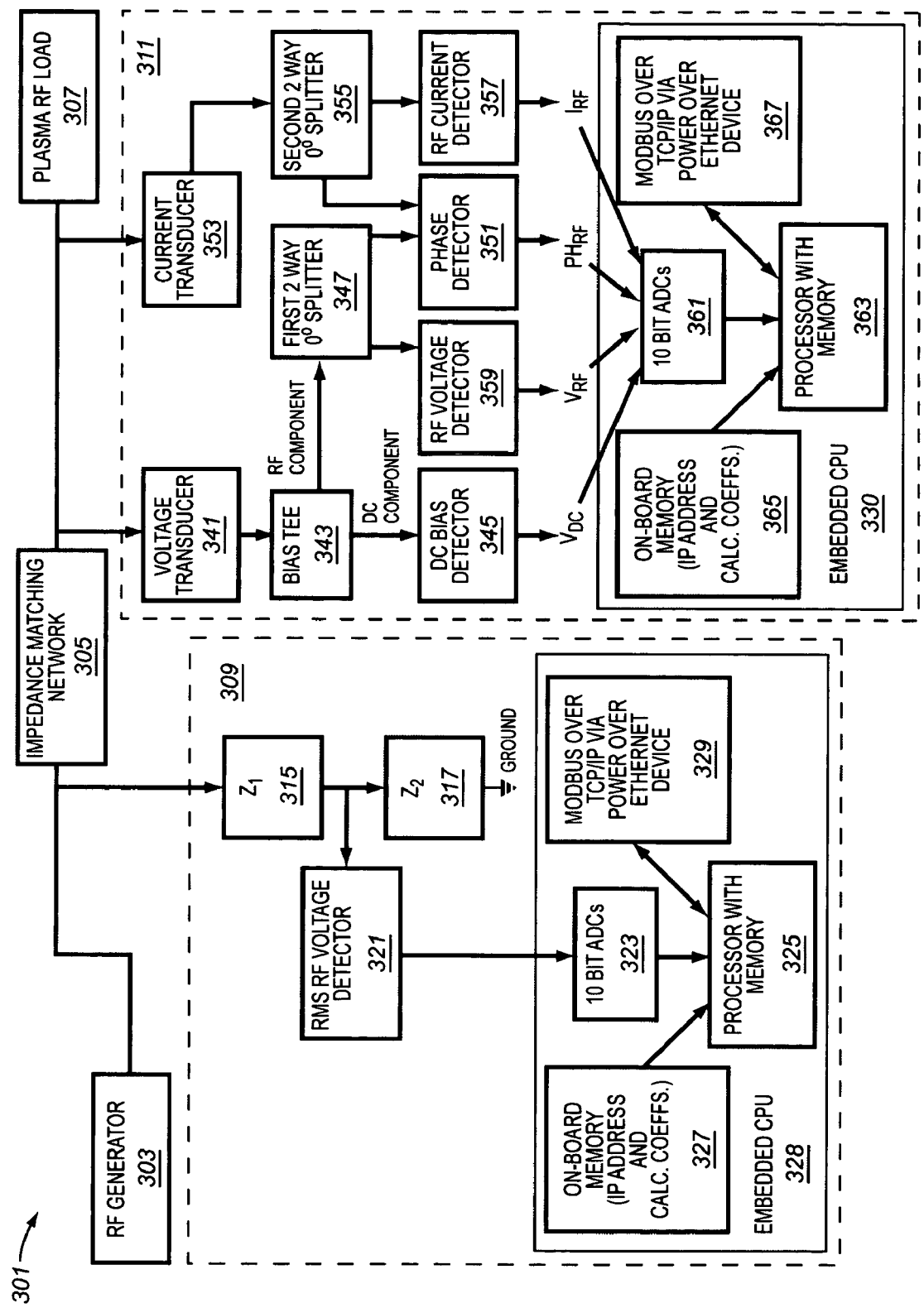
FIG. 3 is a schematic illustration of an RF powered system equipped with RF sensors for measuring the RF power at the input and output of an impedance matching network.

A preferred embodiment of an RF power delivery diagnostic system made in accordance with the teachings herein is illustrated in FIG. 3. As shown therein, the system 301 includes an RF generator 303, an impedance matching network 305, and a plasma load 307. The plasma load 307 may correspond to any of the various RF driven devices, including, for example, a plasma etch reactor.

A first RF sensor 309 is provided for measuring the RF power at the input of an impedance matching network, and a second RF sensor 311 is provided for measuring the RF power at the output of the impedance matching network. The resultant measurements from the sensors 309 and 311 may be communicated to a remote location.

The RF power generator 303 is coupled to the impedance matching network 305 via a power line 313 having an impedance environment that exhibits an impedance $Z_c$. Typically, the value of $Z_c$ will be about 50 ohms, although persons of ordinary skill in the art will appreciate that environments exhibiting other impedances are often encountered, and that the system disclosed herein is not limited to any particular impedance values or environment.

Within the first RF sensor 309 is a voltage divider network that comprises two impedance components 315 and 317 having respective impedances $Z_1$ and $Z_2$. The voltage divider network serves to present to an RMS (root mean square) RF voltage detector 321 a voltage proportional to the RF voltage at the input of the impedance matching network 305. The impedance components 315 and 317 of the voltage divider network may be implemented with resistive and/or capacitive components, thereby eliminating the implementation difficulties encountered with the inductive components of the prior art.

In response to the voltage input to detector 321 from the divider network, detector 321 produces an output analog signal representative of the RMS voltage at the input of the impedance matching network 305. Voltage detector 321 may be implemented using a commercially available integrated circuit.

Embedded within the sensor 309 is a processor 328. Processor 328 receives the output of RF voltage detector 321 and converts it to a digital signal by way of an Analog-to-Digital Converter (ADC) 323. A processing unit 325 receives the digital signal from ADC 323. Processing unit 325 may be implemented using a microprocessor or other digital device capable of accomplishing the requisite functions described herein. Processing unit 325 is also coupled to an on-board memory unit 327 containing calibration coefficients. The calibration coefficients are used to correct for error due to component deviation from nominal values. For example, if resistors are employed as impedance components 317 and 319 for impedances $Z_1$ and $Z_2$, respectively, of the voltage divider network, these resistors will typically deviate from their nominal values by a small percent.

The calibration coefficients may, for example, be chosen to implement a polynomial solution to correct for such errors:

$$y = c + bx + ax^2 \qquad \text{(EQUATION 1)}$$

where x is the input digital representation of the RMS signal from detector 321, a, b, and c are the calibration coefficients from memory unit 327, and y is the calibrated RMS signal, $V_{rms}$. Then, the RMS RF power at the input to impedance matching network 305 is determined in accordance with EQUATION 1:

$$P_i = V^2_{rms}/(Z_c) \qquad \text{(EQUATION 2)}$$

where $Z_c$ is the known characteristic impedance of the power line 313 that couples the generator 303 to the impedance matching network 305.

The measured input power may then be communicated to a remote location or, either alternatively or additionally, to an output power sensor, to be observed, recorded, transmitted or further processed. Communication between the remote location and/or the output power sensor and input power sensor is preferably implemented by a MODBUS 329 using standard protocol over TCP/IP. Moreover, the same communications port may provide power to an input power sensor using power over Ethernet technology to allow for a single data and power access point on the sensor.

The memory unit 327 may also store an IP address identifying the particular measurement location of the first RF sensor 309. Thus, for example, in a network with a plurality of sensors at different locations, communications for each location is provided, enabling selection of the location where a power measurement is to be performed and identification of the location from which a power measurement is received.

At the output of the impedance network 305, the power is measured by an output power sensor 311. Voltage at the output of network 305 is DC coupled to voltage transducer 341, which in a preferred embodiment, acts essentially as a voltage divider to step-down the sensed voltage. The output of the voltage transducer 341 is fed to a bias-tee 343, which separates the DC and AC components of the received voltage. The DC component is detected by DC bias detector 345 and the AC component is fed to a first two-way power splitter 347. One branch of the first power splitter 347 feeds an RF voltage detector 359, and the other output branch of the first power splitter 347 feeds a phase detector 351.

Current at the output of impedance matching network 305 is AC coupled to current transducer 353, the output of which is fed to a second two-way power splitter 355. One branch of the second power splitter 355 feeds an RF current detector 357, and the other output branch feeds phase detector 351.

Phase detector 351 measures the difference in phase between the voltage signal received from the first power splitter 347 and the current signal received from the second power splitter 355. RF voltage detector 359 provides a signal representative of the RMS value of the voltage at the output of impedance network 305. RF current detector 357 provides a signal representative of the RMS value of the current at the output of impedance network 305. The outputs of DC bias detector 345, phase detector 351, RF voltage detector 359, and RF current detector 357 are input to an analog-to-digital converter (ADC) 361 which is disposed within an embedded CPU 330 and which converts these signals to digital form for use by a processing unit 363.

Processing unit 363 may be implemented using a microprocessor or other digital device capable of accomplishing the requisite functions described herein. Processing unit 363 is also coupled to an on-board memory unit 365 containing calibration parameters. The calibration parameters are used to correct for error due to, for example, component deviation from nominal values.

Calibration coefficients may, for example, implement a polynomial solution such as EQUATION 1 above to correct for such errors, where x is the input digital representation of the RMS signal from RF voltage detector 357 or RF current detector 359, a, b, and c are the calibration coefficients from memory unit 365 for the signal from the particular detector, and y is the calibrated RMS output signal, $V_{rms}$, or $I_{rms}$. Then, the RMS RF power at the output of impedance matching network 305 is determined from the calculation:

$$P_o = V_{rms} I_{rms} \cos \phi \quad \text{(EQUATION 3)}$$

where $\cos \phi$ is the cosine of the phase between the voltage and current.

The measured output power may then be communicated to a remote location, or alternatively or additionally, to an input power sensor, to be observed, recorded, transmitted or further processed. Communication between the remote location and/or the input power sensor and output power sensor is preferably implemented by a MODBUS 367 using standard protocol over TCP/IP. Moreover, the same communications port may provide power to an output power sensor using power over Ethernet technology to allow for a single data and power access point on the second RF sensor 311. Memory unit 365 may also store an IP address identifying the location, and hence, the particular measurement location, of the second RF sensor 311. Thus, for example, in a network with a plurality of sensors at different locations, communications for each location is provided, enabling selection of the location where a power measurement is to be performed and identification of the location from which a power measurement is received.

Given the input and output powers, $P_i$, and $P_o$, an efficiency value, $\epsilon(t)$ may be computed and observed over time to track the health of the impedance matching network 305. Efficiency, $\epsilon(t)$, may be computed at remote location, or may be computed within the processing unit of the first 309 or second 311 RF sensors.

One skilled in the art will appreciate from the above description that the RF power delivery diagnostic system described herein provides for measurement of both the power at the input of an impedance matching network and the power at the output of the impedance matching, and enables diagnostic characterization of the entire RF power delivery network, including the impedance matching network. Moreover, the invention provides the ability to maintain calibration information local to each respective measurement site and enables the avoidance of frequency-discrimination circuitry and harmonic analysis of prior art methods.

It will also be appreciated, by comparing the components of RF sensor 309 and RF sensor 311 in FIG. 3, that a simplified RF sensor design has been provided herein for measuring the RF power input to the impedance matching network 305. In particular, since RF sensor 309 operates in a fixed impedance environment (typically 50 ohms), the sensor can be configured to measure only voltage or only current. Since no further parameters need to be measured for the purpose of calculating power, the sensor design is greatly simplified.

It is further to be noted that, while FIG. 3 depicts the first RF sensor 309, the second RF sensor 311, and the impedance matching network 305 as being discrete components, these components may be combined in various ways. Thus, for example, in some embodiments, the first RF sensor 309 and the impedance matching network 305 may be combined into a single device, in which the first RF sensor is in electrical communication with the cable 313 at the input of the device. Some such embodiments may further include the second RF sensor 311, which may be in electrical communication with the cable 313 at the output of the device.

In a variation of the type of embodiment, the impedance matching network may be provided with first and second ports which are adapted to receive a probe (e.g., a banana clip) of an RF sensor, and wherein appropriate circuitry is provided within the device to electrically connect the first port to the input of the impedance matching network 305, and the second port to the output of the impedance matching network 305. An RF sensor may then be removably inserted into either port to measure various characteristics of the RF power upstream or downstream of the impedance matching network.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A system, comprising:
    an RF power source;
    an impedance matching network;
    a plasma reactor in electrical contact with said RF power source by way of said impedance matching network;
    a first RF sensor adapted to measure the RF power $P_i$ at the input of said impedence matching network and equipped with a voltage divider network comprising first and second impedance components having respective impedances of $Z_1$ and $Z_2$;
    a second RF sensor adapted to measure at least one attribute of the RF power output by said impedance matching network; and
    an RMS RF voltage detector.

2. The system of claim 1, wherein said voltage divider network is adapted to present said RMS RF detector with a voltage that is proportional to the RF voltage at the input of the impedance matching network.

3. The system of claim 2, wherein said first and second impedence components are resistive components.

4. The system of claim 2, wherein said first and second impedence components are capacitive components.

5. The system of claim 2, wherein in response to the voltage input to said RMS detector from said voltage divider network, the RMS detector produces an analog signal representative of the RMS voltage at the input of the impedance matching network.

6. The system of claim 1, wherein said first RF sensor is equipped with an ADC that is adapted to receive the signal output by the RMS RF voltage detector and to convert it to a digital signal.

7. The system of claim 6, further comprising:
    a memory unit containing calibration coefficients; and
    a processing unit in communication with said memory unit.

8. The system of claim 7, wherein said memory unit and said processing unit are disposed within said first RF sensor.

9. The system of claim 7, wherein said processing unit is adapted to utilize said calibration coefficients to correct for deviations from nominal values in said first and second impedence components.

10. The system of claim 7, wherein said processing unit is adapted to calibrate the digital signal produced by the ADC in accordance with the equation $y=c+bx+ax^2$, wherein x is the digital signal produced by the ADC, a, b and c are calibration coefficients stored in said memory unit, and y is the calibrated signal.

11. The system of claim 10, wherein said generator is coupled to said impedance matching network via a power line having an impedance $Z_c$, and wherein the processor is adapted to calculate the RMS RF power at the input to the impedance matching network in accordance with the equation:

$$P_i = V^2_{rms}/Z_c$$

where $P_i$ is the RMS RF power at the input to the impedance matching network, V, is the calibrated signal produced by the ADC, and $Z_c$ is the impedance of the power line.

12. The system of claim 11, further comprising a second RF sensor adapted to measure the RF power at the output of said impedance matching network, and wherein said processor is adapted to communicate $P_i$ to said second RF sensor.

13. The system of claim 11, further comprising a communications system adapted to communicate the value of $P_i$ to a remote location.

14. The system of claim 13, wherein said communications system is adapted to provide power to said first RF sensor using power over Ethernet technology.

15. The system of claim 7, wherein said system is incorporated into a network, and wherein said memory unit contains an IP address which identifies the measurement location of the first RF sensor.

16. The system of claim 15, wherein said network contains a plurality of RF sensors, each positioned at a unique location, and further comprising a communications system adapted to communicate with each of said plurality of RF sensors;
    wherein said memory unit contains an IP address which identifies the measurement location of each of said plurality of sensors.

17. The system of claim 16, wherein said system is adapted (a) to permit the selection of one of said plurality of RF sensors for an RF power measurement, (b) to receive RF power measurements from the plurality of RF sensors, and (c) to identify the location from which an RF power measurement is received.

18. A system, comprising:
    an RF power source;
    an impedance matching network;
    a plasma reactor in electrical contact with said RF power source by way of said impedance matching network;
    a first RF sensor adapted to measure the RF power $P_i$ at the input of said impedance matching network;
    a second RF sensor adapted to measure the RF power $P_o$ at the output of said impedance matching network; and
    a voltage detector disposed within said second RF sensor, wherein said voltage detector is DC coupled to the voltage at the output of said impedance matching network, and wherein said voltage detector is adapted to function as a voltage divider to step down the voltage sensed by said voltage detector.

19. A system, comprising:
    an RF power source;
    an impedance matching network;
    a plasma reactor in electrical contact with said RF power source by way of said impedance matching network;
    a first RF sensor adapted to measure the RF power $P_i$ at the input of said impedance matching network;
    a second RF sensor adapted to measure the RF power $P_o$ at the output of said impedance matching network;
    a voltage detector disposed within said second RF sensor, wherein said voltage detector is DC coupled to the voltage at the output of said impedance matching network; and a bias tee in communication with said voltage detector, said bias tee being adapted to separate the output of the voltage detector into its AC and DC components.

20. The system of claim 19, further comprising a DC bias detector which is adapted to detect the DC component of the output of the voltage detector.

21. The system of claim 19, further comprising a phase detector, an RF voltage detector, and a first two-way power splitter adapted to receive the AC component from said bias tee, wherein a first branch of said first power splitter feeds said RF voltage detector, and wherein a second branch of said first power splitter feeds said phase detector.

22. The system of claim 21, further comprising a second two-way power splitter and a current detector, and wherein the output of said current detector is fed to said second two-way power splitter.

23. The system of claim 22, further comprising an RF current detector and a phase detector, wherein a first branch of said two-way power splitter feeds said RF current detector, and wherein a second branch of said two-way power splitter feeds said phase detector.

24. The system of claim 22, wherein said current detector is AC coupled to the output of said impedance matching network.

25. The system of claim 21, further comprising a second two-way power splitter, an RF current detector, and a phase detector, wherein said current detector is AC coupled to the output of said impedence matching network, wherein the output of said current detector is fed to said second two-way power splitter, wherein a first branch of said second two-way power splitter feeds said RF current detector, and wherein a second branch of said second two-way power splitter feeds said phase detector.

26. The system of claim 25, wherein said phase detector is adapted to measure the difference between the voltage received from said first power splitter and the current received from said second power splitter.

27. The system of claim 26, wherein said RF voltage detector is adapted to provide a signal representative of the RMS value of the voltage at the output of the impedence network.

28. The system of claim 26, wherein said RF current detector is adapted to provide a signal representative of the RMS value of the current at the output of the impedence network.

29. The system of claim 28, wherein said second RF sensor further comprises a processing unit and an ADC, and wherein said ADC converts the outputs of said DC bias detector, said voltage detector, said current detector, and said phase detector to a digital form that is processable by said processing unit.

30. The system of claim 29, wherein said second RF sensor further comprises a memory unit, in communication with said processing unit, which contains calibration data for said second RF sensor.

31. The system of claim 30, wherein the RMS RF power $P_o$ at the output of said impedance matching network is determined by the equation $$P_o = V_{rms} I_{rms} \cos \phi,$$

wherein $V_{rms}$ is the calibrated RMS output signal of said voltage detector, $I_{rms}$ is the calibrated RMS output signal of said current detector, and $\cos \phi$ is the cosine of the phase between the voltage and current signals.

32. The system of claim 31, wherein said second RF sensor is equipped with a communications package adapted to communicate the value of $P_o$ to a remote location.

33. The system of claim 31, wherein said system is further adapted to compute and track an efficiency value which is a function of $P_i$ and $P_o$.

34. A system, comprising:

an RF power source;

an impedance matching network;

a plasma reactor in electrical contact with said RF power source by way of said impedance matching network;

a first RF sensor adapted to measure the current and voltage of the RF power input to said impedance matching network;

a second RF sensor adapted to measure the current and voltage of the RF power output by said impedance matching network; and a processor adapted to utilize the RMS of the voltage signals and the RMS of the current signals from said first and second RF sensors to determine the power at the output of the impedance matching network.

* * * * *